(12) United States Patent
Kwan

(10) Patent No.: US 6,296,990 B1
(45) Date of Patent: Oct. 2, 2001

(54) GAS BEARING AND LITHOGRAPHIC APPARATUS INCLUDING SUCH A BEARING

(75) Inventor: Yim Bun Patrick Kwan, Eindhoven (NL)

(73) Assignee: ASM Lithography, B.V., Veldhoven (NL)

(*) Notice: Subject to any disclaimer, the term of this patent is extended or adjusted under 35 U.S.C. 154(b) by 0 days.

(21) Appl. No.: 09/302,849

(22) Filed: Apr. 30, 1999

(30) Foreign Application Priority Data

May 14, 1998 (EP) .................................................. 98201584

(51) Int. Cl.[7] .............................. G03C 5/00; G03F 7/20; F16C 33/14; F16C 33/24; H01L 21/027

(52) U.S. Cl. .......................... 430/322; 384/150; 355/53; 378/35; 378/206

(58) Field of Search ........................... 430/322; 384/130; 378/35, 206; 359/348; 438/942; 355/53

(56) References Cited

U.S. PATENT DOCUMENTS

| 5,675,201 | * | 10/1997 | Komura et al. ................ 31/90.5 |
| 5,777,823 | * | 7/1998 | Gavit ............................... 360/102 |
| 6,144,442 | * | 11/2000 | Mannetje et al. ............... 355/73 |

FOREIGN PATENT DOCUMENTS 98-40791 * 9/1998 (WO).

* cited by examiner

Primary Examiner—Shean C. Wu
(74) Attorney, Agent, or Firm—Pillsbury Winthrop LLP

(57) ABSTRACT

A gas (air) bearing in a ceramic body is made using a separate restriction member to define the air restriction feature. The separate member may be a metal bushing in which an insert is fitted, the insert having an opening defining the actual restriction feature. Alternatively the separate member may be a ceramic plate with restriction features machined by laser or abrasion before or after attachment to the main body.

22 Claims, 2 Drawing Sheets

GAS BEARING AND LITHOGRAPHIC APPARATUS INCLUDING SUCH A BEARING

BACKGROUND OF THE INVENTION

1. Field of the Invention

The present invention relates to gas bearings and particularly to gas bearings for use in moveable object tables or other components of lithographic projection apparatuses.

2. Discussion of Related Art

For the sake of simplicity, the projection system may hereinafter be referred to as the "lens"; however, this term should be broadly interpreted as encompassing various types of projection system, including refractive optics, reflective optics, catadioptric systems and field lenses, for example. The radiation system may also include elements operating according to any of these principles for directing, shaping or controlling the projection beam of radiation and such elements may also be referred to below, collectively or singularly, as a "lens". Any refractive, reflective or catadioptric elements in the radiation or illumination systems may be based on a substrate of glass or another suitable material, and may be provided with either single- or multi-layer coatings as desired. In addition, the first and second object stages may be referred to as the "mask stage" and the "substrate stage", respectively. Further, the lithographic apparatus may be of a type having two or more mask tables and/or two or more substrate tables. In such "multiple stage" devices the additional tables may be used in parallel, or preparatory steps may be carried out on more stages while one or more other stages are being used for exposures. Twin stages lithographic apparatuses are described in International Patent Application WO 98/28665 and WO 98/40791.

Lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosentive material (resist). In general, a single wafer will contain a whole network of adjacent dies which are successively irradiated through the reticle, one at a time. In one type of lithographic projection apparatus, each die is irradiated by exposing the entire reticle pattern onto the die one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally M<1), the speed v at which the wafer table is scanned will be a factor M times that at which the reticle table is scanned. More information with regard to lithographic devices as here described can be gleaned from International Patent Application WO 97/33205.

Lithography apparatuses for the production of Intergrated Circuits (ICs) are being designed to cope with ever larger wafer and/or reticle sizes, which leads to increased size and mass for the substrate and/or mask stage. At the same time there is a continual demand for increased placement accuracy and stability.

The increase in object stage size and mass results in increased servo-bandwidth requirements in the apparatuses. This increases the desired natural resonant frequencies of mechanical components under control. As a result, designers of lithographic apparatus desire to manufacture components in the object stages out of materials that are lighter, more rigid, and/or have higher resonance frequencies. Ceramic materials, such as aluminum oxide, aluminum nitride, silicon carbide or silicon nitride, are considered promising but their poor machinability in the sintered state is a problem.

Gas bearings ("air bearings") are commonly used in positioning in a lithography apparatus because of there cleanroom compatibility and frictionless running. Use of air bearings entails providing air restriction features such as minute apertures or surface grooves on one side of the bearings surfaces, which in turn are connected to air supply channels. In a bearing made of metal, this is easily achieved; however in a ceramic block it is considerably more difficult, because the restriction features are to be much smaller in dimension than the air supply channels in the rest of the block.

SUMMARY OF THE INVENTION

According to the present invention there is provided: a gas bearing comprising a ceramic main body having therein a gas supply channel, and at least one separate restriction member attached to the main body to cover the end of said gas supply channel and defining at least one gas restriction feature in the gas supply channel.

The present invention also provides: a method of manufacturing a gas bearing comprising the steps of:

provided a main body made of ceramic and having therein at least one gas supply channel attaching to said main body at least one separate restriction member to define at least one gas restriction feature in the gas supply channel.

The present invention further provides a lithographic projection apparatus comprising:

a radiation system for supply a projection beam of radiation;

a first object stage provided with a mask table for holding and positioning a mask with a mask pattern;

a second object stage provided with substrate table for holding and positioning a substrate; and a projection system for imaging an irradiated portion of the mask onto a target portion of the substrate with a magnification M, characterized in that at least one of the object stages comprises a ceramic main body with a gas bearing comprising at least one gas supply channel and at least one separate restriction member attached to the main body to define at least one gas restriction feature in the gas supply channel.

The gas channels in the main body may form a network to supply gas to the restriction features.

In the present context, the term ceramic is intended to embrace all engineering materials made from inorganic materials, excluding metals and alloys. In particular it includes various carbides, oxides and nitrides and materials formed by high-temperature processes, e.g. sintering. The term should be interpreted as including cermets, and vitreous materials ("glasses") such as silicates, quartz, various transparent fluorides and other refractories.

By the use of a separate resection member which can be handled more easily than an otherwise monolithic design with the restriction features provided in the main body, the present invention enables sufficiently accurate gas restriction features to be formed without much difficulty. The separate restriction member may be a jewel bearing fitted into a metal bushing (such as bronze, brass or steel, or just a jewel bearing directly fitted into the ceramic main body. Alternatively, the separate member may be a ceramic plate attached to the underside of the main body and with restriction features incorporated either before or after attachment to the main body.

According to a further aspect of the invention there is provided a device manufacturing method comprising the steps of:

providing a substrate which is at least partially covered by a layer of energy-sensitive material;

providing a mask containing a pattern;

using a projection beam of radiation to project an image of at least part of the mask pattern onto a target area of the layer of energy-sensitive material with a magnification M, at least one of the mask and the substrate is supported and positioned during projection by an object stage comprising a ceramic main body with a gas beating comprising at least one gas supply channel formed in said main body and at least one separate restriction member attached to said main body to define at least one gas restriction feature in the gas supply channel.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention will be further described below with reference to exemplary embodiments and the accompanying schematic drawings, in which.

In the drawings, like parts are identified by like reference numerals.

DETAILED DESCRIPTION OF THE PREFERRED EMBODIMENTS

Embodiment 1

Figure 1:
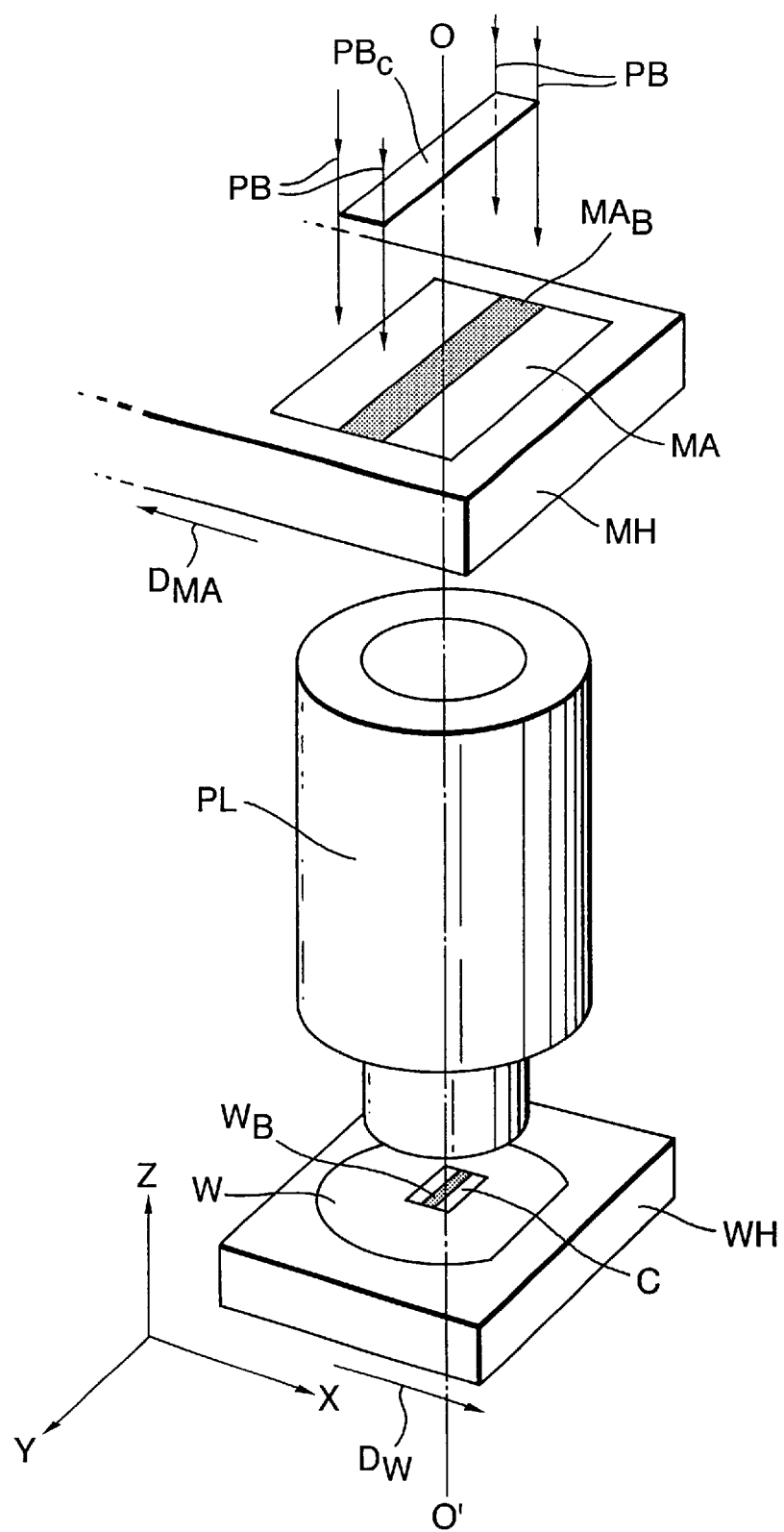
FIG. 1 is a view of part of a step-and-scan lithography apparatus.

The principle of a step-and-scan illumination system is shown in FIG. 1 of the accompanying drawings. This Figure shows a demagnified image of the mask MA formed on the substrate W mounted on table WH in a step-and-scan apparatus; the magnification M of the projection lens system is, for example, ¼. The projection beam PB (e.g. comprising UV light, extreme UV or a charged particle beam) is partially obstructed by reticle masking blades (not shown) so as to have, at the area of the mask, for example, a rectangular cross-section $PB_c$ so that a rectangular part $MA_B$ of this mask is illuminated. This part is imaged by the projection lens systems PL onto a similarly rectangular part $W_B$ of the substrate W. By moving the mask with respect to the substrate synchronously in opposite X directions, as is shown by way of the arrows $D_{MA}$ and $D_W$ in FIG. 1, and by taking the magnification M into account, the entire mask is successively illuminated and the entire mask pattern is imaged onto an area C of the substrate. The mask and the substrate may also be moved in the same X direction.

After the mask pattern has been imaged on a first Integrated Circuit (IC) area on the substrate (a resist-coated semiconductor wafer), the substrate holder is moved with respect to the mask along a distance which is equal to the period of the IC areas in the X direction or the Y direction, and the mask is imaged onto a second IC area.

Figure 2A:
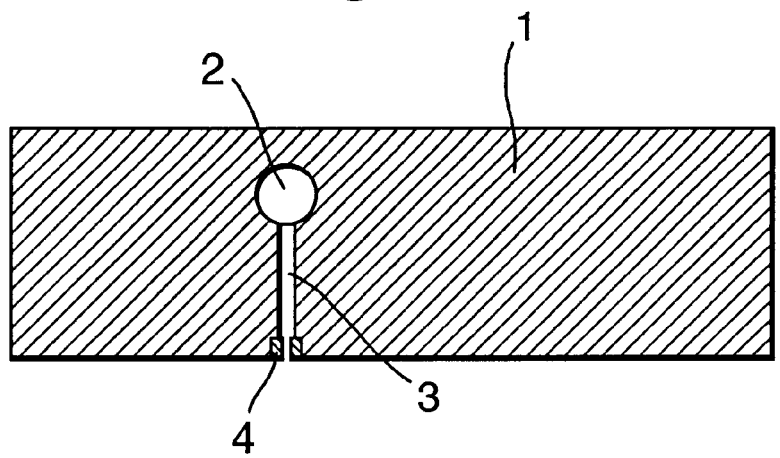
FIG. 2A is a cross-sectional view of a slide component of a positioning table (object table) including a gas bearing according to a first embodiment of the invention.

FIG. 2A shows m cross-section the main body 1 of an air bearing (gas bearing) surface of a slide member in a positioning stage of one of the object tables (MH or WM) according to the present invention. The slide member 1 includes a network of internal bores 2 (only one illustrated) for the distribution of air (or other gas such as $N_2$ or Ar, etc) under pressure to the air bearings. Supply channels 3 (only one illustrate, which have a typical sectional dimension of the order of 2 to 4 mm, lead from the bores 2 to the restriction member 4 which defines the restriction feature in the air bearing.

Figure 2B:
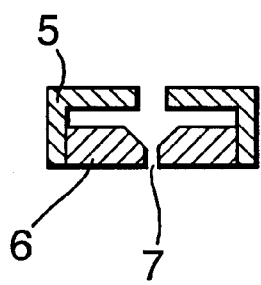
FIG. 2B is an enlarged view of the restriction aperture in the gas bearing of FIG. 2A.

The air restriction member 4 is shown enlarged in FIG. 2B. The air restriction member 4 comprises a metal bushing 5 into which is fitted an insert 6 e.g. of ceramics, sapphire or other jewel material. The air restriction aperture 7 is made in the insert 6, and typically has a dimension (width) of the order of 0.1 to 1 mm. The metal bushing may be made of bronze, brass or steel, for example. Alternatively, the jewel insert 6 can be fitted directly to the main ceramic body 1.

In the manufacture of the bearing, the internal bores 2 and air supply channels 3 are created in a conventional manner. The metal bushing 5 is press-fitted and/or bonded into the mouth of air supply channel 3, and a pocket is subsequently machined in the bushing to the appropriate dimensions and at an appropriate position. The insert 6 is then press-fitted and/or bonded into this pocket of the bushing.

Jewel bearings available for use for watch making, or ceramic ferrules for mounting optical fibers, may be used in the invention; alternatively, inserts with the appropriate aperture may be specially manufactured by known techniques.

Embodiment 2

Figure 3:
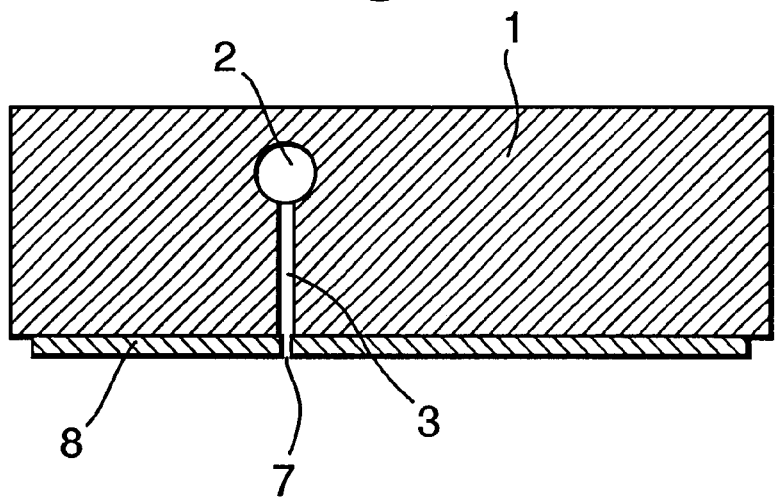
FIG. 3 is a cross-section view of a slide component of a positioning table including a gas bearing according to a second embodiment of the invention.

A second embodiment of the invention is shown in FIG. 3. In this embodiment the air supply channel 3 is extended to the surface of the main body 1 of the slide member and can either take the form of a hole with a diameter of order 3 mm normal to the surface, or a network of recur grooves cut on the bottom surface of the main body. A thin ceramic plate 8, forming the restriction member, is bonded, either with a cold-setting adhesive or by ceramic bonding techniques, to the underside of the main body 1, and defines the air restriction feature 7, which is again of the order of 0.1 to 1 mm in diameter. The thickness of the thin ceramic plate 8 is of order 1 to 5 mm. The air restriction feature 7 may be a straight through-hole in the ceramic plate 8, or may include recess pockets or shallow surface grooves for better distribution of air-pressure.

To manufacture the positioning table (e.g. wafer table) according to the second embodiment, the air supply channels 3 are first created in the conventional manner. The ceramic plate 8 is then bonded to the lower surface of the main body. The air restriction apertures 7 can be machined by laser or abrasion, e.g. masked particle blasting (fluid-assisted abrasion) or ultrasonic machining (ultrasonic-assisted abrasion), either before or after the bonding process. The apertures can also be machined by conventional means on the ceramic plate in the green state before full sintering. Finally the lower surface of the ceramic plate is finished to the required degree of flatness.

It should be explicitly stated that the present invention is not limited to use in lithographic apparatuses. For example, the invention can also be used in other applications where a table or other mass must be supported and isolated from vibrations, such as optical benches, beam etching apparatus, and microscopes, especially scanning-tunneling microscopes.

What is claimed is:

1. A gas bearing comprising a ceramic main body defining therein a gas supply channel, and at least one separate restriction member attached to the main body to cover an end of said gas supply channel and defining at least one gas restriction feature in the gas supply channel.

2. A gas bearing comprising:
a ceramic main body defining therein a gas supply channel, and
at least one separate restriction member attached to the main body to cover an end of said gas supply channel and defining at least one gas restriction feature in the gas supply channel,
wherein the at least one separate restriction member comprises a metal bushing having fitted therein an insert defining the gas restriction feature.

3. A gas bearing comprising:
a ceramic main body defining therein a gas supply channel, and
at least one separate restriction member attached to the main body to cover an end of said gas supply channel and defining at least one gas restriction feature in the gas supply channel,
wherein the at least one separate restriction member comprises a ceramic plate bonded to an outer surface of said main body and having at least one opening defining the gas restriction feature.

4. A gas bearing comprising:
a ceramic main body defining therein a gas supply channel, and
at least one separate restriction member attached to the main body to cover an end of said gas supply channel and defining at least one gas restriction feature in the gas supply channel,
wherein said at least one separate restriction member comprises a jewel bearing directly fitted to said main body and having a through-hole defining said gas restriction feature.

5. A lithographic projection apparatus, comprising:
a radiation system constructed and arranged to supply a projection beam of radiation;
a first object stage provided with a mask table;
a second object stage provided with a substrate table; and
a projection system constructed and arranged to image an irradiated portion of a mask held by said mask table onto a target portion of a substrate held by said substrate table with a magnification M;
wherein at least one of said object stages comprises a ceramic main body with a gas bearing comprising at least one gas supply channel and at least one separate restriction member attached to said main body to define at least one gas restriction feature in the gas supply channel.

6. A method of manufacturing a gas bearing comprising:
providing a main body made of ceramic and having therein at least one gas supply channel; and
attaching to said main body at least one separate restriction member to define at least one gas restriction feature in the gas supply channel.

7. A method of manufacturing a gas bearing comprising:
providing a main body made of ceramic and having therein at least one gas supply channel; and
attaching to said main body at least one separate restriction member to define at least one gas restriction feature in the gas supply channel,
wherein the at least one separate restriction member comprises a metal bushing having mounted therein an insert having a through-hole defining said gas restriction feature.

8. A method according to claim 7, wherein said attaching comprises:
mounting said metal bushing on said main body,
machining an internal pocket in said metal bushing to fit said insert; and
mounting said insert in said metal bushing.

9. A method of manufacturing a gas bearing comprising:
providing a main body made of ceramic and having therein at least one gas supply channel; and
attaching to said main body at least one separate restriction member to define at least one gas restriction feature in the gas supply channel,
wherein said at least one separate restriction member comprises a ceramic plate having at least one opening defining a gas restriction feature.

10. A method according to claim 9, wherein the opening is machined by a laser.

11. A method according to claim 9, wherein the opening is machined by abrasion.

12. A method according to claim 9, wherein the opening is machined in the ceramic plate prior to complete sintering thereof.

13. A method according to claim 9, further comprising finishing a lower surface of said ceramic plate to a desired flatness.

14. A method of manufacturing a gas bearing comprising:

providing a main body made of ceramic and having therein at least one gas supply channel; and attaching to said main body at least one separate restriction member to define at least one gas restriction feature in the gas supply channel, wherein said at least one separate restriction member comprises a jewel bearing directly fitted to said main body and having a through-hole defining a gas restriction feature.

15. A device manufacturing method, comprising:

providing a substrate which is at least partially covered by a layer of energy-sensitive material;

providing a mask containing a pattern;

projecting an image of at least part of the mask pattern onto a target area of the layer of energy-sensitive material with a magnification M using a projection beam of radiation, wherein at least one of the mask and the substrate is supported and positioned during projection by an object stage comprising a ceramic main body with a gas bearing comprising at least one gas supply channel formed in said main body and at least one separate restriction member attached to said main body to define at least one gas restriction feature in the gas supply channel.

16. A device manufactured in accordance with the method of claim 15.

17. A method of manufacturing a gas bearing comprising:

providing a main body made of ceramic and having therein at least one gas supply channel; and attaching to said main body at least one separate restriction member to define at least one gas restriction feature in the gas supply channel, providing wherein said at least one separate restriction member comprises a ceramic plate having at least one opening defining the gas restriction feature.

18. A method according to claim 17, wherein the opening is machined by a laser.

19. A method according to claim 17, wherein the opening is machined by abrasion.

20. A method according to claim 17, wherein the opening is machined in the ceramic plate prior to complete sintering thereof.

21. A method according to claim 17, further comprising finishing a lower surface of said ceramic plate to a desired flatness.

22. A method according to claim 17, wherein said restriction member comprises a jewel bearing directly fitted to said main body and having a through-hole defining the gas restriction feature.

* * * * *